(12) United States Patent
Mukherjee et al.

(10) Patent No.: US 7,102,937 B2
(45) Date of Patent: Sep. 5, 2006

(54) SOLUTION TO DQS POSTAMBLE RINGING PROBLEM IN MEMORY CHIPS

(75) Inventors: Sugato Mukherjee, Boise, ID (US); Wen Li, Boise, ID (US); Christopher K. Morzano, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/886,428

(22) Filed: Jul. 7, 2004

(65) Prior Publication Data

US 2006/0007757 A1    Jan. 12, 2006

(51) Int. Cl.
*G11C 7/00* (2006.01)

(52) U.S. Cl. ............ 365/193; 265/189.05; 265/230.08; 265/233

(58) Field of Classification Search ................ 365/193
See application file for complete search history.

(56) References Cited

U.S. PATENT DOCUMENTS 5,801,998 A * 9/1998 Choi ........................ 365/193
6,172,938 B1 * 1/2001 Suzuki et al. ............... 365/233
6,930,953 B1 * 8/2005 Heragu et al. .............. 365/233

* cited by examiner

*Primary Examiner*—Tan T. Nguyen
(74) *Attorney, Agent, or Firm*—Edward L. Pencoske

(57) ABSTRACT

The disclosed system and method significantly reduce or eliminate DQS postamble ringing problem in modern high-speed memory chips, allowing the memory chips to be operated at significantly faster clock speeds. The external strobe signal (XDQS) may be used to generate at least two derivative strobe signals therefrom. Instead of the XDQS signal, the derivative strobe signals are then used, in a predetermined order, to clock in or strobe the data to be written into memory cells. The last generated derivative strobe signal may be used to finally transfer the data bits into memory cells. Once the last of the derivative strobe signals is activated, and so long as there are no more data writes pending in the command pipe for the next clock cycle, the rising or falling edge of the last derivative strobe signal can be detected to turn off further generation of the strobe signals prior to any onset of postamble ringing on the XDQS signal. Thus, false data may not get "clocked in" or written into the memory chip because of postamble ringing. This prevents data corruption and preserves the integrity of the data written into a memory chip.

18 Claims, 5 Drawing Sheets

US 7,102,937 B2

SOLUTION TO DQS POSTAMBLE RINGING PROBLEM IN MEMORY CHIPS

BACKGROUND

1. Field of the Disclosure

The present disclosure generally relates to memory devices and, more particularly, to a system and method to avoid DQS postamble ringing during memory writes.

2. Brief Description of Related Art

Memory devices are widely used in many electronic products and computers to store data. A memory device is a semiconductor electronic device that includes a number of memory cells, each cell storing one bit of data. The data stored in the memory cells can be read during a read operation. FIG. 1 is a simplified block diagram showing a memory chip or memory device 12. The memory chip 12 may be part of a DIMM (dual in-line memory module) or a PCB (printed circuit board) containing many such memory chips (not shown in FIG. 1). The memory chip 12 may include a plurality of pins 24 located outside of chip 12 for electrically connecting the chip 12 to other system devices. Some of those pins 24 may constitute memory address pins or address bus 17, data (XDQ) pins or data bus 18, and control pins or control bus 19. It is evident that each of the reference numerals 17–19 designates more than one pin in the corresponding bus. Further, it is understood that the schematic in FIG. 1 is for illustration only. That is, the pin arrangement or configuration in a typical memory chip may not be in the form shown in FIG. 1.

A processor or memory controller (not shown) may communicate with the chip 12 and perform memory read/write operations. The processor and the memory chip 12 may communicate using address signals on the address lines or address bus 17, data signals on the data lines or data bus 18, and control signals (e.g., a row address select (RAS) signal, a column address select (CAS) signal, an external data strobe (XDQS) signal, etc. (not shown)) on the control lines or control bus 19. The "width" (i.e., number of pins) of address, data and control buses may differ from one memory configuration to another.

Those of ordinary skill in the art will readily recognize that memory chip 12 of FIG. 1 is simplified to illustrate one embodiment of a memory chip and is not intended to be a detailed illustration of all of the features of a typical memory chip. Numerous peripheral devices or circuits may be typically provided along with the memory chip 12 for writing data to and reading data from the memory cells 26. However, these peripheral devices or circuits are not shown in FIG. 1 for the sake of clarity.

The memory chip 12 may include a plurality of memory cells 26 generally arranged in rows and columns to store data in rows and columns. A row decode circuit 28 and a column decode circuit 30 may select the rows and columns in the memory cells 26 in response to decoding an address, provided on the address bus 17. Data to/from the memory cells 26 is then transferred over the data bus 18 via sense amplifiers and a data output path (not shown). A memory controller (not shown) may provide relevant control signals (not shown) on the control bus 19 to control data communication to and from the memory chip 12 via an I/O (input/output) circuit or I/O unit 32. The I/O circuit 32 may include a number of data output buffers to receive the data bits from the memory cells 26 (e.g., during a memory read operation) and provide those data bits or data signals to the corresponding data lines in the data bus 18. Alternatively, during a memory write operation, the I/O unit 32 may receive data bits externally supplied by a processor or memory controller (not shown) and may transfer or write the data bits into appropriate memory cells 26 using the externally supplied data strobe signal (XDQS) as discussed in more detail hereinbelow.

The memory controller (not shown) may determine the modes of operation of memory chip 12. Some examples of the input signals or control signals (not shown in FIG. 1) on the control bus 19 include an External Clock signal, a Chip Select signal, a Row Access Strobe signal, a Column Access Strobe signal, a Write Enable signal, an external data strobe signal (XDQS), etc. The memory chip 12 communicates to other devices connected thereto via the pins 24 on the chip 12. These pins, as mentioned before, may be connected to appropriate address, data and control lines to carry out data transfer (i.e., data transmission and reception) operations.

FIG. 2 illustrates a prior art circuit showing how two bits of data (D0, D1) are written into appropriate memory cells 26 using the external strobe signal (XDQS) 19. It is noted here that for the sake of convenience the reference numeral "19" is used in the discussion below to refer to the XDQS signal or XDQS pin on the memory device 12. As discussed before, the XDQS pin is of course part of a set of control signal pins 19. However, because the following discussion is primarily related to the XDQS signal (as opposed to other control signals in the control bus 19), the reference numeral "19" is conveniently used to refer to the XDQS signal. This usage is for sake of convenience only and, does not, in any way, imply that the XDQS signal is the only control signal in the control bus 19. Furthermore, as FIG. 2 is illustrative in nature, only two bits of data (D0 and D1) are shown being written into memory cells 26. It is evident to one skilled in the art that the circuit shown in FIG. 2 may be replicated (e.g., by adding additional flipflops) for each data pin and for transferring or writing more than two data bits, as needed.

In FIG. 2, an external data pin (XDQ) 18 is shown to carry data bits to be written into memory cells 26. Again, as in the case with the designation of the XDQS pin, the reference numeral "18" is conveniently used to refer to one of the data pins—the XDQ signal or pin, instead of the entire data bus 18. It is evident that many more such XDQ pins 18 constitute the data bus. The data bits over the XDQ pin 18 are supplied to two data flipflops 36, 38, which are "strobed" or clocked by the external data strobe signal (XDQS) 19. Typically, the externally supplied strobe signal—the XDQS signal 19—is first received at an input buffer 34 in the I/O unit 32. The Enable control 40 of the buffer 34 allows controlled application of the XDQS signal 19 to the flipflops 36, 38. When the Enable control 40 is turned "on" or "activated", the XDQS signal 19 is buffered through the buffer 34. On the other hand, turning "off" or deactivating the Enable control 40 may prevent further transmission of the XDQS signal 19 out of the buffer 34. In FIG. 2, the buffered XDQS signal 19 is designated as the DQS (data strobe) signal 39, which is the internal strobe signal that is used by the I/O unit 32 to strobe data on the XDQ pin 18 into appropriate memory cells 26. Thus, memory's internal data strobe signal (the DQS signal) 39 is derived from the external strobe signal XDQS 19. Further, as seen from the circuit configuration in FIG. 2, each of the data bits is output on one of the edges—rising edge or falling edge—of the DQS signal 39. Thus, the circuit configuration in FIG. 2 may be used to write data into a DDR (Double Data Rate) SDRAM (Synchronous Dynamic Random Access Memory) chip.

FIG. 3 depicts a typical XDQS signal 19 and an exemplary memory data write operation using the XDQS signal 19 as the data strobe signal. The XDQS signal 19, per its specification, may contain a preamble ringing 42 and a postamble ringing 44. Although the signals in the preamble and postamble ringings 42, 44 are shown as triangular waves, it is understood that these signals may have any form—sinusoidal, triangular, sawtooth, random etc. Further, as is known in the art, the signal level of the XDQS signal 19 during these pre- and post-amble ringings 42, 44, is undefined. However, after preamble ringing 42 is over, the XDQS signal 19 stabilizes and transitions in synchronism with the system clock (not shown). The lined portion in the data waveform in FIG. 3 indicates unknown state of the data pin. The data bits may be valid only during certain times. In FIG. 3, the data bits 0-4 on the external data pin (XDQ) 18 are shown to appear in appropriate timing relationship with the XDQS signal's rising and falling edges. The XDQS signal 19 may keep toggling (in synchronism with the system clock (not shown)) until all data bits are written. For example, in FIG. 3, only four data bits are to be written and, hence, the XDQS signal 19 remains "active" for two cycles to strobe four data bits into the memory cells 26—one data bit on each of the two rising and two falling edges.

As is known to one skilled in the art, the specification for the XDQS signal 19 defines a postamble time 46 as the time for which the XDQS signal 19 remains in a "low" state after the last bit of data (e.g., Bit 3 in FIG. 3) is clocked in. After the postamble time 46, however, the state of XDQS 19 is no longer guaranteed and it could assume any value. After the postamble time 46, the postamble ringing 44 may start and any such ringing on XDQS 19 may cause erroneous bits of data to be clocked in because the postamble ringing 44 may be erroneously recognized by the data latching flipflops (e.g., the flipflops 36 and 38 in FIG. 2) as valid data clocking edges (or edge transitions) of the XDQS signal 19. But, as shown in FIG. 3, during the postamble ringing period 44, the state of data signals on the data pin XDQ 18 is unknown because the last bit of data (e.g., Bit 3 in FIG. 3) is already written and there is no more data to write. Therefore, any triggering of data flipflops by postamble ringing will result in incorrect data bits to be written into memory cells.

To avoid accidental triggering of data flipflops 36, 38 during postamble ringing 44 (and, hence, to avoid incorrect data outputs to be sent to memory cells 26), the data writing circuitry in FIG. 2 turns "off" or deactivates the Enable control 40 during the postamble time 46 so as to effectively prevent the application of the XDQS signal 19 (and its postamble ringing 44) to the data flipflops 36, 38 via the DQS signal 39. Thus, the Enable control 40 prevents the DQS signal 39 from having the postamble ringing 44 of the XDQS signal 19. However, this approach may be well suited for slower speed DDR SDRAM memory chips, where the postamble time 46 may be in the range of 3-5 nanoseconds (ns). In the modern, faster DDR2 and DDR3 SDRAM chips, the clock periods of the system clocks themselves are in the range of 2.5 to 3 ns. Such DDR2 and DDR3 chips, in turn, require correspondingly shorter postamble time 46 because the postamble time 46 is typically equal to 0.4 $t_{CK}$ (where "$t_{CK}$" represents the clock period of the system clock) per XDQS specification. Therefore, in such faster versions of DDR SDRAM chips, the postambe time 46 would be typically in the range of 1 to 1.2 ns. This time of 1–1.2 ns may be too short for the Enable control 40 to turn off the buffer 34 in time prior to onset of postamble ringing 44 because of the very high frequency of XDQS 19 and DQS 39 signals. The high frequency DQS signal 39 may be itself 0.25$t_{CK}$ early or late with reference to the system clock. Therefore, the effective time for the buffer 34 to act prior to postamble ringing 44 is even less than 1–1.2 ns.

It is thus seen that the current buffer-based control of DQS postamble ringing may not be effective in itself, especially when modern memory chips are operated at ever faster clock speeds. Therefore, it is desirable to devise a scheme whereby DQS postamble ringing problem in higher speed memory chips is significantly reduced or eliminated so that false data may not get "clocked in" or written into the memory chip because of postamble ringing. The prevention of data corruption and preservation of integrity of data written into a memory chip is also desirable.

SUMMARY

The present disclosure contemplates a method that comprises receiving an external strobe signal; and generating two or more derivative strobe signals using the external strobe signal.

In one embodiment, the present disclosure contemplates a method of writing data into a memory device. The method comprises receiving a first strobe signal for data to be written into the memory device, wherein the data includes a first portion and a second portion; generating a second strobe signal and a third strobe signal upon receiving the first strobe signal; and writing the data into the memory device using the second and the third strobe signals instead of using the first strobe signal.

In another embodiment, the present disclosure contemplates a memory device and a system using that memory device. The memory device comprises a plurality of memory cells to store data; and an I/O unit configured to facilitate a data write operation into one or more of the plurality of memory cells, wherein the I/O unit includes: a first circuit to receive a primary strobe signal for data to be written during the data write operation, wherein the primary strobe signal may contain postamble ringing occurring after a postamble time, and a second circuit coupled to the first circuit to receive the primary strobe signal therefrom and to responsively generate two or more derivative strobe signals.

The system and method of the present disclosure significantly reduce or eliminate DQS postamble ringing problem in modern high-speed memory chips, allowing the memory chips to be operated at significantly faster clock speeds. The external strobe signal (XDQS), which may contain postamble ringing, is used to generate at least two derivative strobe signals therefrom. However, instead of the XDQS signal, the derivative strobe signals are used, in a predetermined order, to clock in or strobe the data to be written into memory cells. Once the last of the derivative strobe signals is activated, and so long as there are no more data writes pending in the command pipe for the next clock cycle, the rising or falling edge of the last derivative strobe signal can be detected to turn off further generation of the strobe signals prior to any onset of postamble ringing on the XDQS signal. Thus, false data may not get "clocked in" or written into the memory chip because of postamble ringing. This prevents data corruption and preserves the integrity of the data written into a memory chip.

BRIEF DESCRIPTION OF THE DRAWINGS

For the present disclosure to be easily understood and readily practiced, the present disclosure will now be described for purposes of illustration and not limitation, in connection with the following figures, wherein.

DETAILED DESCRIPTION

Reference will now be made in detail to some embodiments of the present disclosure, examples of which are illustrated in the accompanying drawings. It is to be understood that the figures and descriptions of the present disclosure included herein illustrate and describe elements that are of particular relevance to the present disclosure, while eliminating, for the sake of clarity, other elements found in typical solid-state electronic devices, memories or memory-based systems. It is noted at the outset that the terms "connected", "connecting," "electrically connected," etc., are used interchangeably herein to generally refer to the condition of being electrically connected. It is further noted that various block diagrams and circuit diagrams shown and discussed herein employ logic circuits that implement positive logic, i.e., a high value on a signal is treated as a logic "1" whereas a low value is treated as a logic "0." However, any of the circuit discussed herein may be easily implemented in negative logic (i.e., a high value on a signal is treated as a logic "0" whereas a low value is treated as a logic "1"). It is observed here that although various action verbs, such as "strobing" or "clocking", are used interchangeably in conjunction with data "write" or data "transfer" operations discussed below, the synonymous nature of the meaning of those action verbs (as understood by one skilled in the art) may be evident from the context.

Figure 4:
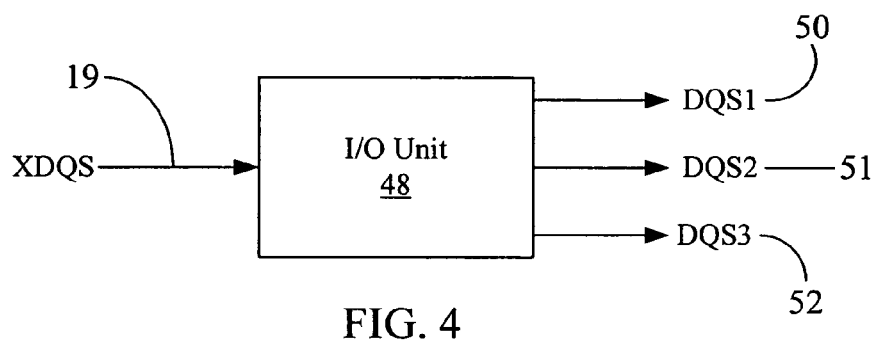
FIG. 4 schematically shows operation of a memory I/O unit according to one embodiment of the present disclosure.

FIG. 4 schematically shows operation of a memory I/O unit 48 according to one embodiment of the present disclosure. The I/O unit 48 may be considered as a modified version of the I/O unit 32 in FIG. 1. That is, except for the addition of the strobe generation and application functionality discussed hereinbelow with reference to FIGS. 5–9, the I/O unit 48 is substantially similar to the I/O unit 32. Therefore, for the sake of convenience and ease of discussion, the description below uses the same reference numerals as those appearing in FIG. 1 to refer to the same memory chip 12, except that the memory chip 12 in the following discussion is assumed to contain the I/O unit 48 instead of the I/O unit 32 shown in FIG. 1. The I/O unit 48 receives the XDQS signal 19 as its input and generates at least two derivative strobe signals (i.e., signals 50–52 in FIG. 4) therefrom. These derivative strobe signals, in turn, may then be used to "clock in" or "strobe" data bits to be written into memory. Thus, instead of directly using XDQS signal 19 (or indirectly using the XDQS signal through its buffered alternative DQS signal 39), the I/O unit 48 uses the derivative strobe signals to strobe data. This approach, as discussed hereinbelow, substantially reduces or eliminates the postamble ringing problem of XDQS signal in modern high-speed memories. In the embodiment of FIG. 4, three derivative strobe signals DQS1 (50), DQS2 (51) and DQS3 (52) are shown being output from the I/O unit 48. However, as discussed below with reference to FIG. 8, the I/O unit 48 may be configured to generate only two derivative strobes from the XDQS input to accomplish the desired avoidance of postamble ringing.

Figure 5:
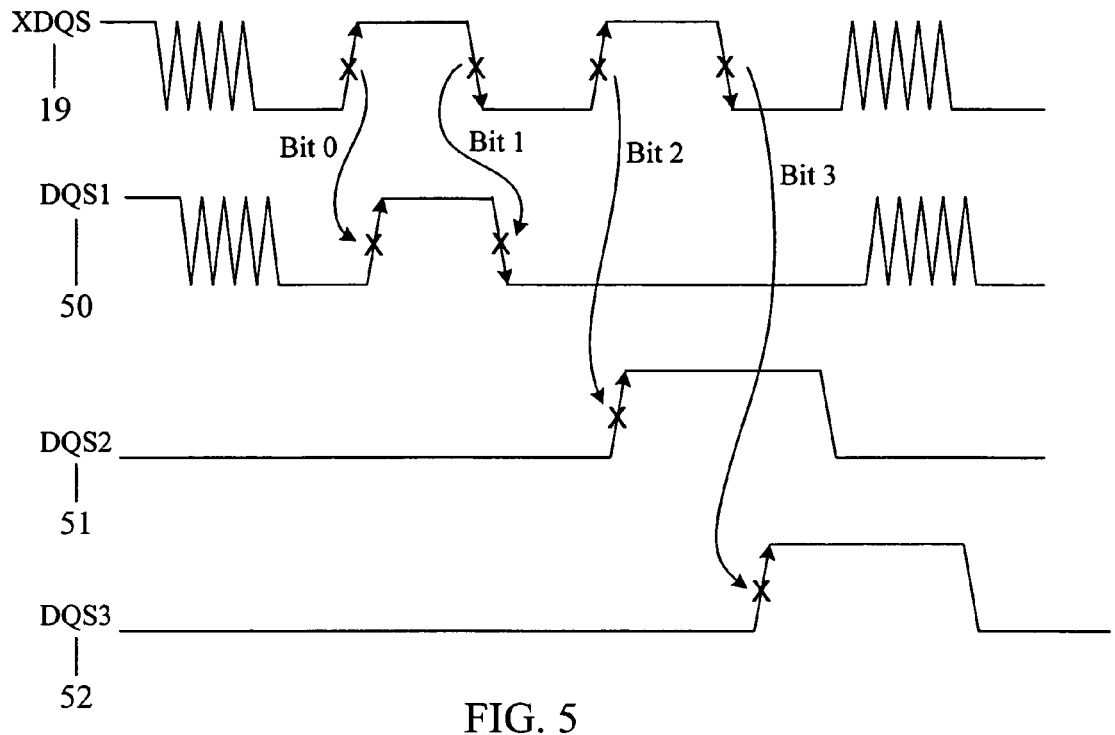
FIG. 5 illustrates exemplary input and output (derivative) strobe signal waveforms for the I/O unit depicted in FIG. 4.

FIG. 5 illustrates exemplary input and output (derivative) strobe signal waveforms for the I/O unit 48 depicted in FIG. 4. As seen from FIG. 5, the derivative strobes 50–52 bear a certain timing relationship with the input XDQS strobe 19. In one embodiment, the DQS1 strobe 50 may even contain the preamble and postamble ringings present on the XDQS input 19. However, as discussed below, the effects of postamble ringing present on the DQS1 strobe 50 may be eliminated by properly timing the DQS2 and DQS3 strobes so as to shut off data clocking prior to onset of the postamble ringing on the DQS1 strobe. FIG. 5 illustrates an example of how four bits of data may be written into memory cells 26 using different rising and falling edges of the three derivative strobes 50–52. Thus, in the embodiment of FIG. 5, the data are strobed using different rising and falling edges of three different strobe signals, instead of a single XDQS strobe signal as has been the case in current memory systems. It is noted here that the "on" or "active" period of the DQS2 and DQS3 strobes may be different from that shown in FIG. 5. However, in the embodiment of FIG. 5, the rising edges of DQS2 and DQS3 strobes should preferably occur simultaneously (or with a very small delay) with the rising and falling edges, respectively, of the XDQS signal 19 so as to properly write data bits 2 and 3 prior to onset of postamble ringing on the XDQS signal 19.

Figure 6:
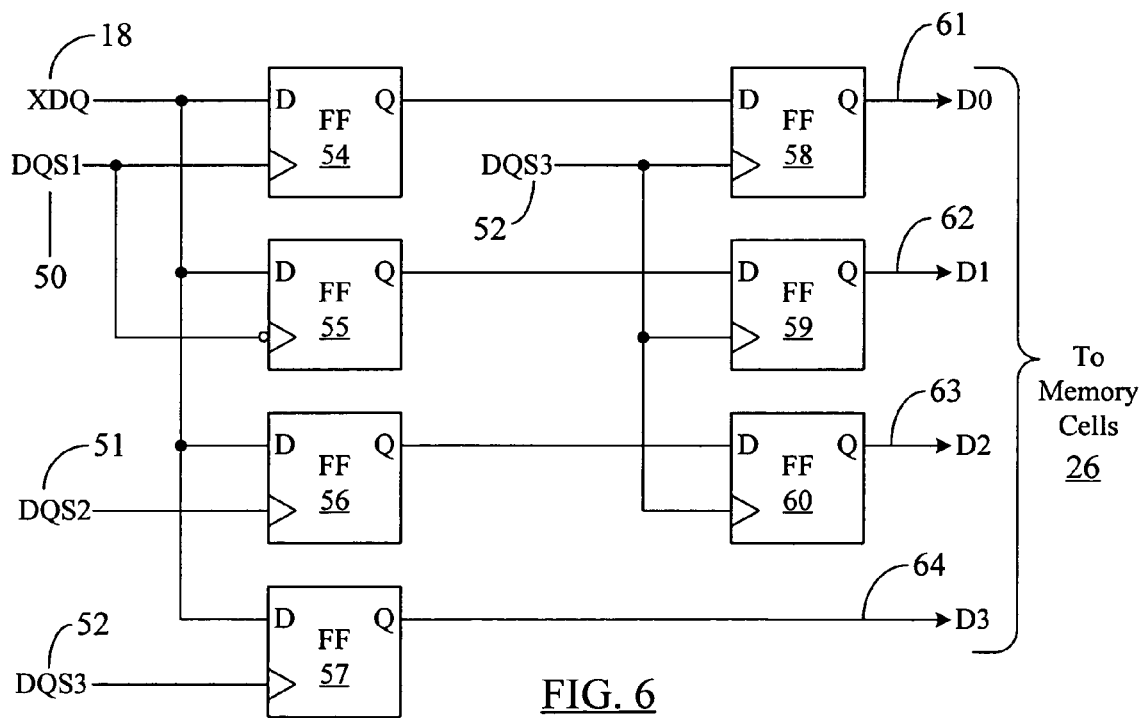
FIG. 6 depicts an exemplary circuit diagram showing how the strobe signals shown in FIG. 5 are used to write data bits into memory cells.

FIG. 6 depicts an exemplary circuit diagram showing how the strobe signals 50–52 shown in FIG. 5 are used to write data bits D0–D3 into memory cells 26. A single data pin XDQ 18 is shown in FIG. 6, however, it is evident that the circuit arrangement shown in FIG. 6 may be replicated for each data pin in the data bus 18. As is seen from FIG. 6, four bits of data serially arriving on the data pin XDQ 18 is fed into four D-flipflops 54–57, and each data flipflop 54–57 is clocked or "strobed" by appropriate rising and/or falling edges of the derivative strobe signals 50–52. The serially-arriving data bits, however, are written into or transferred to memory cells 26 in parallel using the rising edge of DQS3 (52) to simultaneously clock the flipflops 57–60. Thus, the first data bit (Bit 0) is latched by the flipflop 54 and transferred to the input of flipflop 58 at the rising edge of DQS1 (50), in a manner similar to that shown in FIG. 5. Similarly, the second data bit (Bit 1) is latched by the flipflop 55 and transferred to the input of flipflop 59 at the falling edge of DQS1 (50) as also shown in FIG. 5. The third data bit (Bit 2) is transferred to the flipflop 60 at the rising edge of DQS2 (51). Eventually, all four data bits (Bit 0–Bit 3) are clocked in parallel by the rising edge of DQS3 (52) to be transferred (or "written") as data inputs D0–D3 (61–64) into appropriate memory cells 26. As can be seen from FIGS. 5 and 6, the parallel data writing operation is controlled by the rising edge of the strobe DQS3, which occurs prior to onset of any postamble ringing on XDQS 19 or DQS1 (50). Thus, it is seen that if data strobing by DQS3 can be turned off prior to the postamble ringing, as is discussed below, inaccurate data writing due to postamble ringing may be prevented.

Figure 7:
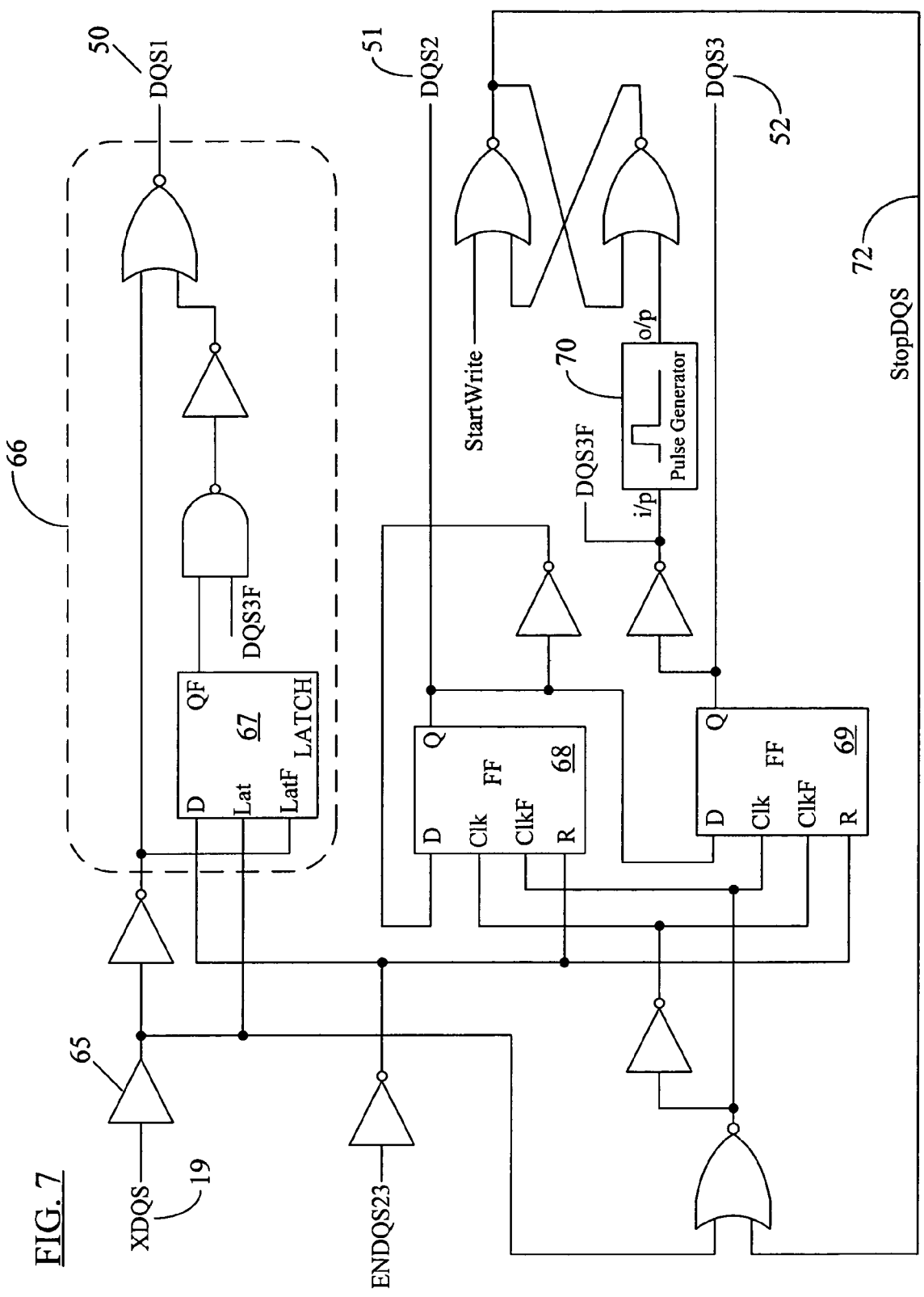
FIG. 7 illustrates a detailed circuit layout showing generation of derivative strobe signals according to one embodiment of the present disclosure.

FIG. 7 illustrates a detailed circuit layout showing generation of derivative strobe signals 50–52 according to one embodiment of the present disclosure. The derivative strobes 50–52 generated using the circuit of FIG. 7 may be used to clock data in the circuit configuration of FIG. 6. In FIG. 7, the external strobe signal XDQS 19 is applied through a buffer 65 to a first circuit portion 66, which includes a data latch 67 and other digital logic elements. The DQS1 strobe signal 50 is generated at the output of the circuit portion 66. In operation, when the Lat and LatF inputs of the latch 67 are logic "0" and "1", respectively, the QF output of the latch 67 represents the complement ($\overline{D}$) of the input signal at D input of the latch 67. However, when the Lat and LatF inputs of the latch 67 are logic "1" and "0", respectively, the QF output of the latch 67 latches the complement ($\overline{D}$) of the D input and makes the latched signal available to the NAND gate following the latch 67. Further the DQS3F signal at the other input of the NAND gate in the circuit portion 66 is generated at the output of the D flipflop 69. The DQS3F signal is the inverted version of DQS3, i.e., DQS3F is normally high, but it goes low at the rising edge of DQS3 (i.e., when DQS3 is generated at the output of the flipflop 69). Thus, the circuit portion 66 shuts off generation of DQS1 when DQS2 is "ON", but enables or "turns on" DQS1 after DQS3 is "ON" (i.e., DQS3F is "low" or at "0" level). This timing relationship is depicted in FIG. 5.

The other two strobe signals DQS2 (51) and DQS3 (52) are generated at the output of data flipflops 68 and 69, respectively. The timing relationship between DQS2 and DQS3 may be similar to that shown in FIG. 5. It is observed here that a pulse generator 70 is used in the circuit of FIG. 7 to generate the StopDQS signal 72, which disables generation of DQS2 and DQS3 after DQS3 goes "high" (i.e., at the rising edge of DQS3) so as to prevent postamble ringing problem. The pulse generator 70 generates a high pulse at the low-going edge (i.e., falling edge) of its input. It is seen in FIG. 7 that the pulse generator 70 receives the DQS3F (inverted version of DQS3) signal at its input. Therefore, upon rising edge of DQS3 (i.e., falling edge of DQS3F), the pulse generator triggers a high pulse which generates the StopDQS signal 72 at logic "1" level. The "high" level of StopDQS signal 72 then effectively shuts off further generation of DQS2 and DQS3 at the outputs of flipflops 68 and 69, respectively. This timing relationship is also depicted in the waveforms of FIG. 5. During the next data write operation, the StartWrite signal (active "high") may be applied or activated to bring the StopDQS signal 72 to "low" or logic "0" level so as to allow generation of DQS2 and DQS3 signals when needed. Furthermore, the ENDQS23 signal (active "high") may also be used to reset all derivative strobes 50–52 to the "low" or logic "0" level.

From the foregoing discussion of the circuit in FIG. 7, it is seen that even though the DQS1 strobe (50) is turned "on" or "activated" after DQS3 is turned on (i.e., after the appearance of the rising edge of DQS3), the postamble ringing present on DQS1 (as shown in FIG. 5) may not have any deleterious effect on data writing operation because of (1) the turning off of DQS2 and DQS3 by the StopDQS signal 72 promptly after generation of DQS3, and (2) the use of only DQS3 (independently of the state of DQS1) to clock all four data bits into memory cells as shown, for example, in FIG. 6. Thus, in the circuit configuration of FIG. 7, as soon as the last strobe signal (DQS3) is generated or "fired" (i.e., generation of the rising edge of DQS3) and so long as no more data writes are pending in the command pipe for the next system clock cycle (as can be evident, for example, by inactivation of the StartWrite signal in FIG. 7), the rising edge of that last strobe signal DQS3 is detected and the state machine generating DQS2 and DQS3 is immediately shut down so as to prevent clocking of false or incorrect data by the postamble ringing on XDQS 19 or DQS1 (50).

Figure 8:
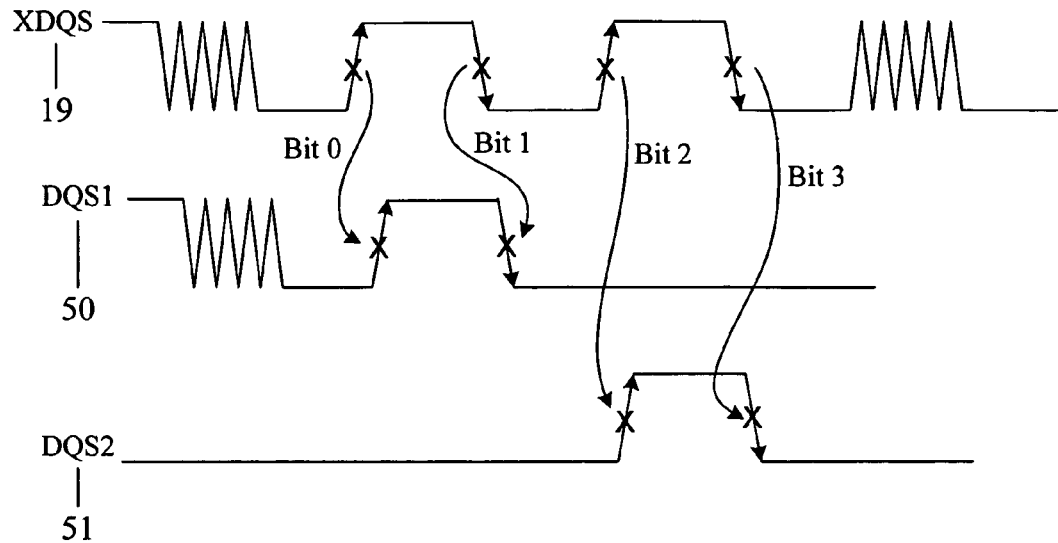
FIG. 8 is similar to FIG. 5, except that only two derivative strobe signals are used in the embodiment of FIG. 8 to write four data bits into memory.
Figure 9:
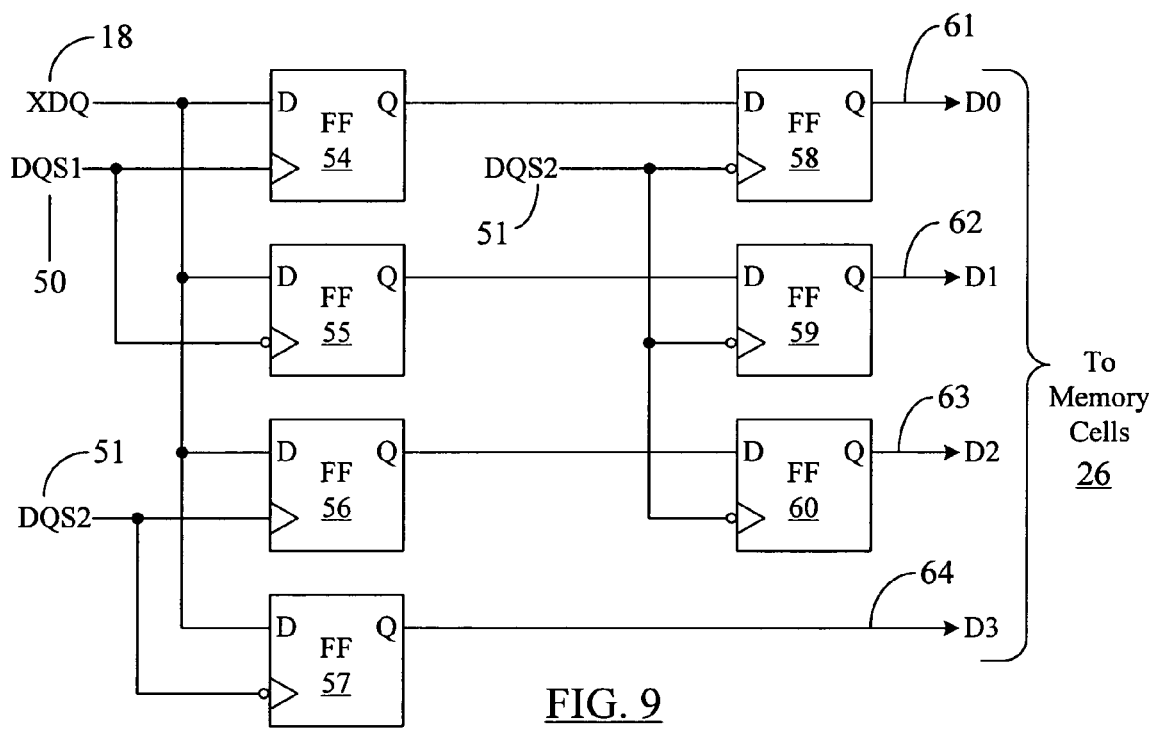
FIG. 9 is similar to FIG. 6 and illustrates an exemplary circuit diagram showing how the strobe signals shown in FIG. 8 are used to write data bits into memory cells.

FIG. 8 is similar to FIG. 5, except that only two derivative strobe signals 50–51 are used in the embodiment of FIG. 8 to write four data bits (Bit 0–Bit 3) into memory. A comparison of FIGS. 5 and 8 shows that the embodiment of FIG. 8 uses the falling edge of DQS2 (51) as a triggering signal that not only clocks the four data bits into memory (as shown in FIG. 9), but also shuts off the further generation of DQS1 and DQS2. It is already noted before with reference to FIG. 7 that the generation of DQS1 may be prevented so long as DQS2 is "on" or "active." However, further reactivation of DQS1 may be prevented using the falling edge of DQS2. Thus, in the embodiment of FIG. 8, the falling edge of DQS2 serves in a manner similar to the rising edge of DQS3 in FIG. 5. It is observed that one skilled in the art can easily devise a circuit similar to that shown in FIG. 7 or appropriately modify the circuit in FIG. 7 to implement the timing relationship shown in FIG. 8. Therefore, no additional discussion of the circuit to generate the waveforms of FIG. 8 is provided herein.

FIG. 9 is similar to FIG. 6 and illustrates an exemplary circuit diagram showing how the strobe signals 50–51 shown in FIG. 8 are used to write data bits (D0–D3) into memory cells 26. A comparison of FIGS. 6 and 9 illustrates the differences between the two implementations. In FIG. 9, the falling edge of DQS2 (51) is used to clock four data bits D0–D3 (61–64) in parallel into memory cells 26, instead of the rising edge of DQS3 (52) in the implementation of FIG. 6. All circuit elements in FIGS. 6 and 9 are referenced by the same reference numerals for the sake of convenience and ease of discussion only. Also, because of the substantial similarity between the circuits in FIGS. 6 and 9, no additional discussion of FIG. 9 is provided herein. It is observed here that the embodiment of FIG. 9 may be implemented differently or in conjunction with the embodiment of FIG. 6, as desired.

Figure 1:
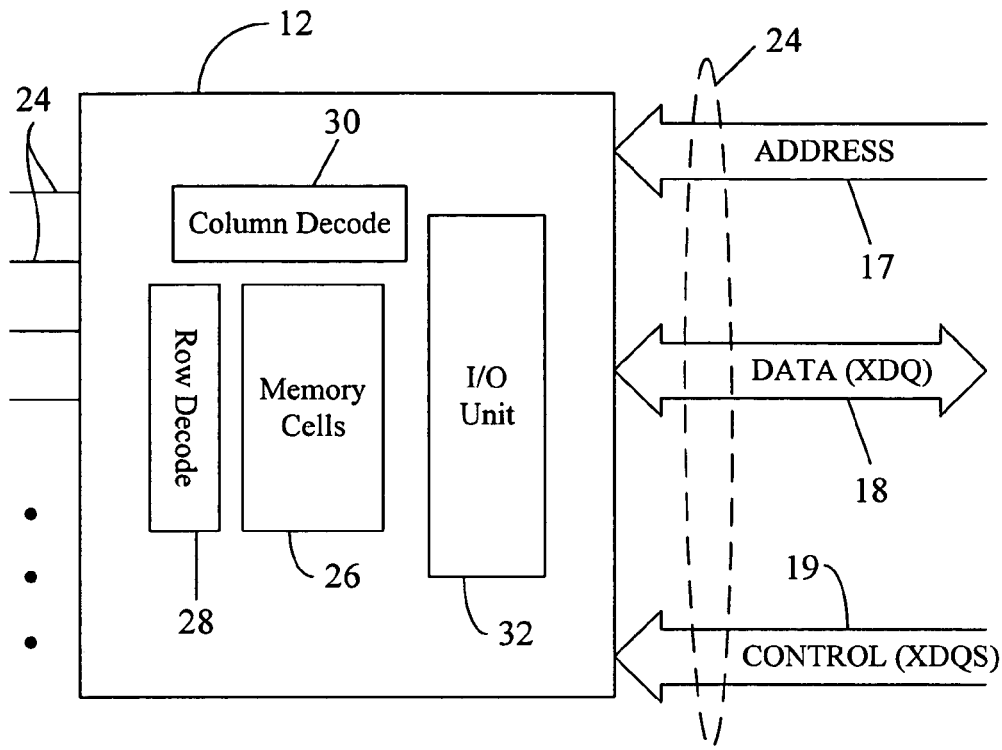
FIG. 1 is a simplified block diagram showing a memory chip or memory device.
Figure 2:
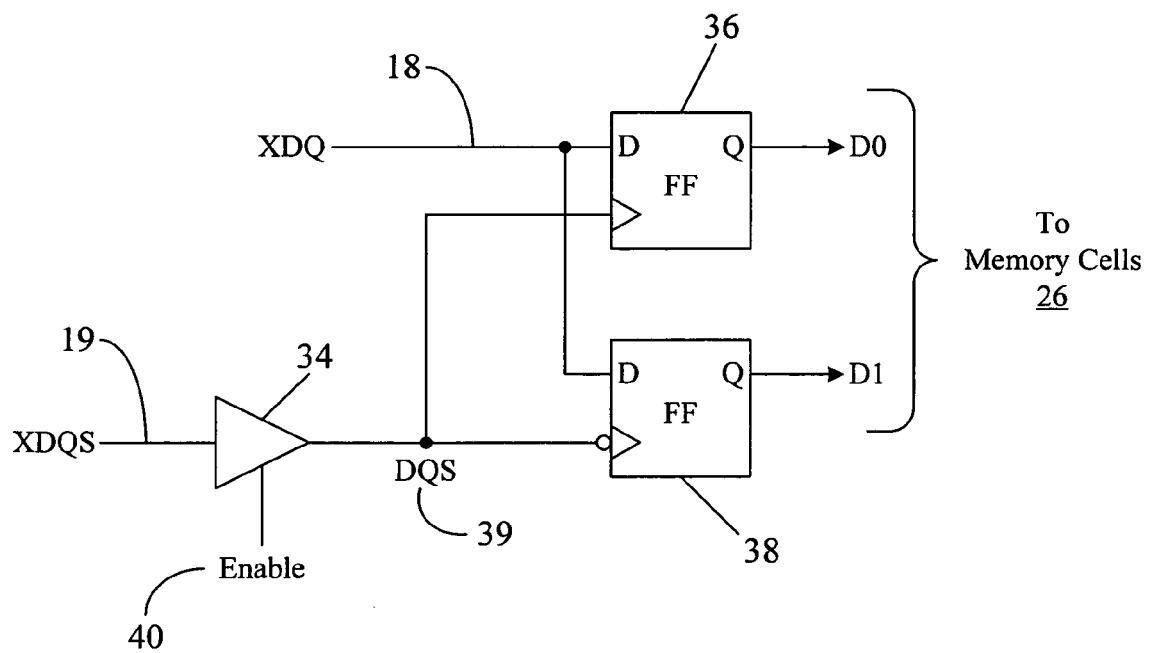
FIG. 2 illustrates a prior art circuit showing how two bits of data (D0, D1) are written into appropriate memory cells using the external strobe signal (XDQS)
Figure 3:
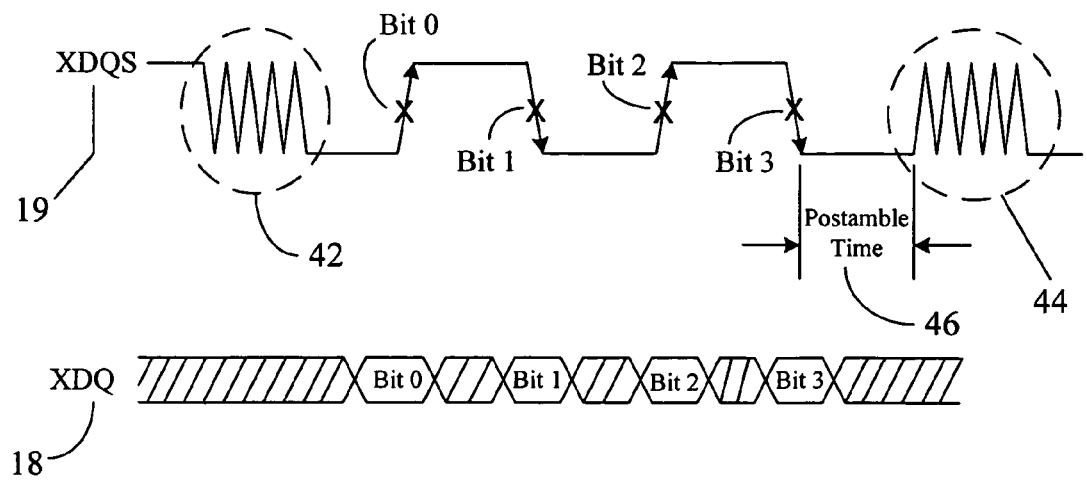
FIG. 3 depicts a typical XDQS signal and an exemplary memory data write operation using the XDQS signal as the data strobe signal.
Figure 10:
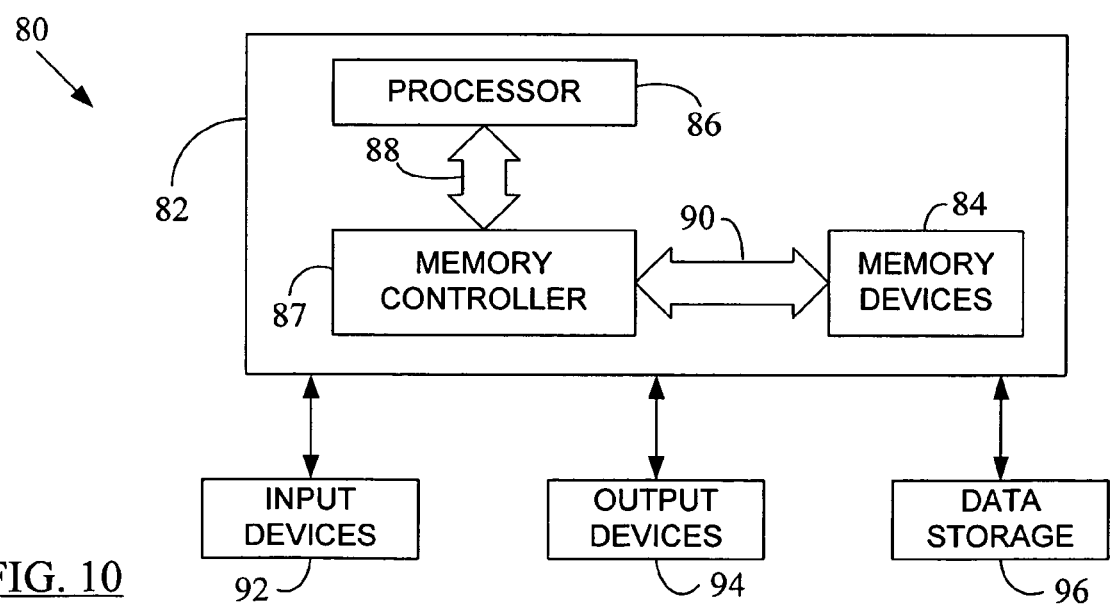
FIG. 10 is a block diagram depicting a system in which one or more memory chips of FIG. 1 having the I/O unit of FIG. 4 may be used.

FIG. 10 is a block diagram depicting a system 80 in which one or more memory chips 12 of FIG. 1 having the I/O unit 48 of FIG. 4 may be used. The set of memory chips 12 (with I/O units 48) is depicted as block 84 in FIG. 10. It is noted that, although not shown in FIG. 10, the system 80 may include memory chips other than those containing I/O units 48. It is observed here that, as noted before, the I/O unit 48 may generate and use less than three, but at least two, derivative strobe signals (e.g., as shown in FIGS. 8 and 9) to clock data bits into memory. Each of the memory devices 84 can be a dynamic random access memory (DRAM) or another type of memory circuits such as SRAM (Static Random Access Memory) or Flash memories. Furthermore, the DRAM could be a synchronous DRAM commonly referred to as SGRAM (Synchronous Graphics Random Access Memory), SDRAM (Synchronous Dynamic Random Access Memory), SDRAM II, or DDR SDRAM (Double Data Rate SDRAM), as well as Synchlink or Rambus DRAMs. The system 80 may include a data processing unit or computing unit 82 that includes a processor 86 for performing various computing functions, such as executing specific software to perform specific calculations or data processing tasks. The computing unit 82 also includes a memory controller 87 that is in communication with the processor 86 through a bus 88. The memory controller 87 can be a microprocessor, digital signal processor, embedded processor, micro-controller, dedicated memory test chip, or the like. The memory controller 87 may control routine data transfer operations to/from the memory devices 84. The memory controller 87 may reside on the same motherboard (not shown) as that carrying the memory chips 84. Various other configurations of electrical connection between the memory chips 84 and the memory controller 87 may be possible. For example, the memory controller 87 may be a remote entity communicating with the memory chips 84 via a data transfer or communications network (e.g., a LAN (local area network) of computing devices).

The bus 88 may include an address bus (not shown), a data bus (not shown), and a control bus (not shown). The memory controller 87 is also in communication with the set of memory devices 84 through another bus 90. In one embodiment, each memory device 84 is a DDR2 or DDR3 DRAM chip. Each memory device 84 may include appropriate data storage and retrieval circuitry (not shown in FIG. 10) as shown in FIG. 1. The processor 86 can perform a plurality of functions based on information and data stored in the memories 84. The system 80 may include one or more input devices 92 (e.g., a keyboard or a mouse) connected to the computing unit 82 to allow a user to manually input data, instructions, etc., to operate the computing unit 82. One or more output devices 94 connected to the computing unit 82 may also be provided as part of the system 80 to display or otherwise output data generated by the processor 86. Examples of output devices 94 include printers, video terminals or video display units (VDUs). In one embodiment, the system 80 also includes one or more data storage devices 96 connected to the data processing unit 82 to allow the processor 86 to store data in or retrieve data from internal or external storage media (not shown). Examples of typical data storage devices 96 include drives that accept hard and floppy disks, CD-ROMs (compact disk read-only memories), and tape cassettes.

The foregoing describes a system and method to significantly reduce or eliminate DQS postamble ringing problem in modern high-speed memory chips, allowing the memory chips to be operated at significantly faster clock speeds. The external strobe signal (XDQS) may be used to generate at least two derivative strobe signals therefrom. Instead of the XDQS signal, the derivative strobe signals are then used, in a predetermined order, to clock in or strobe the data to be written into memory cells. The last generated derivative strobe signal may be used to finally transfer the data bits into memory cells. Once the last of the derivative strobe signals is activated, and so long as there are no more data writes pending in the command pipe for the next clock cycle, the rising or falling edge of the last derivative strobe signal can be detected to turn off further generation of the strobe signals prior to any onset of postamble ringing on the XDQS signal. Thus, false data may not get "clocked in" or written into the memory chip because of postamble ringing. This prevents data corruption and preserves the integrity of the data written into a memory chip.

While the disclosure has been described in detail and with reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

What is claimed is:

1. A method, comprising:
   receiving an external strobe signal;
   generating two or more derivative strobe signals using said external strobe signal; and
   preventing further generation of at least one of said two or more derivative strobe signals upon detecting onset of a postamble time.

2. The method of claim 1, further comprising strobing data using said two or more derivative strobe signals instead of said external strobe signal.

3. The method of claim 1, wherein said external strobe signal contains postamble ringing occurring after said postamble time.

4. A method of writing data into a memory device, comprising:
   receiving a first strobe signal for data to be written into said memory device, wherein said data includes a first portion and a second portion;
   generating a second strobe signal and a third strobe signal upon receiving said first strobe signal; and
   writing said data into said memory device using said second and said third strobe signals instead of using said first strobe signal.

5. The method of claim 4, further comprising:
   detecting a falling edge of said third strobe signal; and
   preventing further generation of said third strobe signal upon detecting said falling edge.

6. The method of claim 4, further comprising:
   generating a fourth strobe signal upon receiving said first strobe signal; and
   writing said data into said memory device using said second, said third, and said fourth strobe signals.

7. The method of claim 6, further comprising:
   detecting a rising edge of said fourth strobe signal; and
   preventing further generation of said third and said fourth strobe signals upon detecting said rising edge.

8. The method of claim 6, wherein writing said data into said memory device includes:
   using said second and said third strobe signals to latch said first portion of said data; and
   using only said fourth strobe signal to send said first and said second portions of said data for storage into said memory device.

9. The method of claim 8, wherein using only said fourth strobe signal includes using only a rising edge of said fourth strobe signal to send said first and said second portions of said data for storage into said memory device.

10. The method of claim 4, wherein writing said data into said memory device includes:
    using said second strobe signal and a rising edge of said third strobe signal to latch said first portion of said data; and
    using only said third strobe signal to send said first and said second portions of said data for storage into said memory device.

11. The method of claim 10, wherein using only said third strobe signal includes using only a falling edge of said third strobe signal to send said first and said second portions of said data for storage into said memory device.

12. A memory device, comprising:
    a plurality of memory cells to store data; and
    an I/O unit configured to facilitate a data write operation into one or more of said plurality of memory cells, wherein said I/O unit includes:

a first circuit to receive a primary strobe signal for data to be written during said data write operation, wherein said primary strobe signal contains postamble ringing occurring after a postamble time, and a second circuit coupled to said first circuit to receive said primary strobe signal therefrom and to generate two or more derivative strobe signals.

13. The memory device of claim 12, wherein said I/O unit further includes:

a third circuit coupled to said second circuit to receive said two or more derivative strobe signals therefrom and to transfer said data to one or more of said plurality of memory cells using said two or more derivative strobe signals instead of using said primary strobe signal.

14. The memory device of claim 12, wherein said I/O unit further includes:

a third circuit coupled to said second circuit and configured to control said second circuit to prevent further generation of at least one of said two or more derivative strobe signals upon detecting onset of said postamble time.

15. A system, comprising:

a processor;

a bus; and a memory device coupled to said processor via said bus, wherein said memory device includes:

a plurality of memory cells to store data, and an I/O unit configured to facilitate a data write operation from said processor into one or more of said plurality of memory cells via said bus, wherein said I/O unit includes:

a first circuit to receive a external strobe signal from said processor over said bus for data to be written during said data write operation, wherein said external strobe signal contains postamble ringing occurring after a postamble time, and a second circuit coupled to said first circuit to receive said external strobe signal therefrom and to responsively generate two or more derivative strobe signals.

16. The system of claim 15, wherein said I/O unit further includes:

a third circuit coupled to said second circuit to receive said two or more derivative strobe signals therefrom and to transfer said data to one or more of said plurality of memory cells using said two or more derivative strobe signals instead of using said external strobe signal during said data write operation.

17. The memory device of claim 15, wherein said I/O unit further includes:

a third circuit coupled to said second circuit and configured to control said second circuit to prevent further generation of at least one of said two or more derivative strobe signals upon detecting onset of said postamble time.

18. In a method of strobing data into a memory device using an XDQS signal, an improvement comprising:

generating at least two DQS signals from said XDQS signal; and strobing said data into said memory device using said at least two DQS signals instead of using said XDQS signal.

* * * * *

UNITED STATES PATENT AND TRADEMARK OFFICE
CERTIFICATE OF CORRECTION

PATENT NO.         : 7,102,937 B2
APPLICATION NO.    : 10/886428
DATED              : September 5, 2006
INVENTOR(S)        : Sugato Mukherjee et al.

It is certified that error appears in the above-identified patent and that said Letters Patent is hereby corrected as shown below:

Column 3, Line 59, delete "postambe" and substitute therefore --postamble--.

Column 5, Line 45, delete "circuit" and substitute therefore --circuits--.

Column 10, Line 26, after "said first strobe signal" insert --; and preventing further generation of at least one of said second or third strobe signals upon detecting onset of a postamble time--.

Column 11, Line 7, after "strobe signals" insert --prior to said postamble time--.

Column 11, Line 33, delete "a external" and substitute therefore --an external--.

Column 12, Line 6, delete "responsively".

Column 12, Line 7, after "strobe signals" insert --prior to said postamble time--.

Column 12, Lines 27 - 28, after "said XDQS signal" insert --outside of a postamble time--.

Signed and Sealed this

Twenty-third Day of October, 2007

JON W. DUDAS
*Director of the United States Patent and Trademark Office*